(12) United States Patent
Oh et al.

(10) Patent No.: US 9,647,666 B1
(45) Date of Patent: May 9, 2017

(54) TRANSMITTER AND SEMICONDUCTOR DEVICE

(71) Applicant: SK hynix Inc., Icheon-si, Gyeonggi-do (KR)

(72) Inventors: Sang Muk Oh, Icheon-si (KR); Jong Chern Lee, Icheon-si (KR); Jun Hyun Chun, Icheon-si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 15/060,859

(22) Filed: Mar. 4, 2016

(30) Foreign Application Priority Data

Dec. 2, 2015 (KR) .................. 10-2015-0170817

(51) Int. Cl.
*H03L 5/00* (2006.01)
*H03K 19/0185* (2006.01)

(52) U.S. Cl.
CPC ............... *H03K 19/018521* (2013.01)

(58) Field of Classification Search
CPC ...... H03K 17/10; H03K 17/102; H03K 17/12; H03K 17/122; H03K 17/16; H03K 17/161; H03K 17/30; H03K 17/302; H03K 19/003; H03K 19/00307; H03K 19/00315; H03K 19/00346; H03K 19/00353; H03K 19/00361; H03K 25/026; H03K 17/107; H03K 17/127; H03K 17/56; H03K 17/567; H03K 17/60; H03K 17/687; H03K 17/6871; H03K 17/164; H03K 17/668; H03K 19/0013; H03K 19/018521; H03K 19/0175; H03K 5/003; G06F 3/00; G06F 3/1295
USPC ......................................... 327/108–112, 333
See application file for complete search history.

(56) References Cited

U.S. PATENT DOCUMENTS

| | | | | |
|---|---|---|---|---|
| 7,834,654 | B2 * | 11/2010 | Millar | G11O 5/063 326/30 |
| 8,873,317 | B2 * | 10/2014 | Matsuoka | G11C 7/1057 365/189.05 |
| 2014/0347098 | A1 * | 11/2014 | Ecker | H03K 19/01750 326/70 |

FOREIGN PATENT DOCUMENTS

KR          1020020005874 A         1/2002

* cited by examiner

*Primary Examiner* — Lincoln Donovan
*Assistant Examiner* — Diana J Cheng
(74) *Attorney, Agent, or Firm* — William Park & Associates Ltd.

(57) ABSTRACT

A transmitter may include a pre-driver and a main driver. The pre-driver may be configured to generate a pull-up signal and a pull-down signal in response to an enabling signal and a first data. The main driver may receive an external voltage and a ground voltage. The main driver may be configured to generate a transmission data in response to the pull-up signal and the pull-down signal. The pull-up signal and the pull-down signal may be enabled to a voltage level higher than the external voltage applied to the main driver.

7 Claims, 3 Drawing Sheets

TRANSMITTER AND SEMICONDUCTOR DEVICE

CROSS-REFERENCES TO RELATED APPLICATION

The present application claims priority under 35 U.S.C. §119(a) to Korean application number 10-2015-0170817, filed on Dec. 2, 2015, in the Korean Intellectual Property Office, which is incorporated herein by reference in its entirety.

BACKGROUND

1. Technical Field

Various embodiments generally relate to a semiconductor integrated circuit device, more particularly, to a transmitter and a semiconductor device.

2. Related Art

A semiconductor device may transmit and receive a signal such as data to/from an external semiconductor device.

Further, the semiconductor device may include circuits configured to transmit and receive a signal therebetween.

Thus, the semiconductor device may include a circuit configured to transmit the signal and a circuit configured to receive the signal.

SUMMARY

According to an embodiment, there may be provided a transmitter. The transmitter may include a pre-driver a main driver. The pre-driver may be configured to generate a pull-up signal and a pull-down signal in response to an enabling signal and a first data. The main driver may receive an external voltage and a ground voltage. The main driver may be configured to generate transmission data in response to the pull-up signal and the pull-down signal. The pull-up signal and the pull-down signal may be enabled to a voltage level higher than the external voltage applied to the main driver.

According to an embodiment, there may be provided a semiconductor device. The semiconductor device may include a signal-transmitter and a signal-receiver. The signal-transmitter may be configured to generate a pull-up signal and a pull-down signal in response to a first data. The signal-transmitter may also be configured to output a transmission data to input/output lines in response to the pull-up signal and the pull-down signal. The signal-receiver may be configured to output a second data in response to the transmission data received through the input/output lines. The first data and the second data may have substantially the same swing width. The pull-up signal and the pull-down signal may have a swing width greater than the swing width of the first and second data. The transmission data may have a swing width narrower than the swing width of the first and second data.

DETAILED DESCRIPTION

Figure 1:
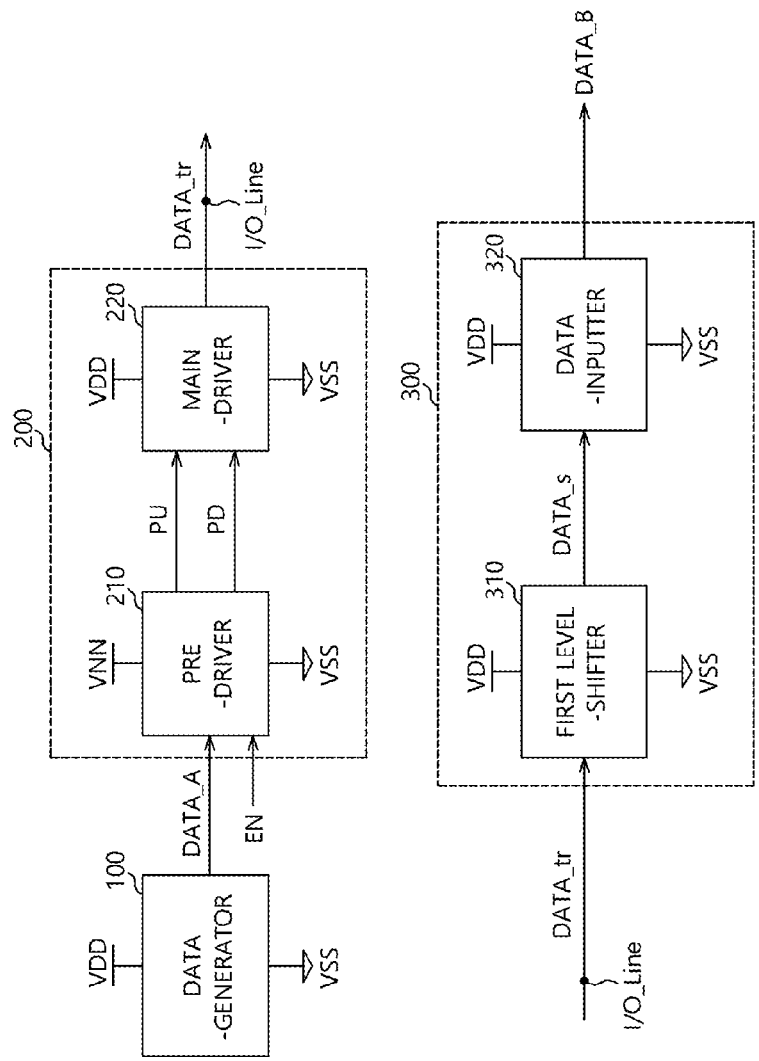
FIG. 1 is a block diagram illustrating a semiconductor device in accordance with example embodiments.

Various examples of embodiments will be described hereinafter with reference to the accompanying drawings, in which some examples of the embodiments are illustrated. The embodiments may, however, be embodied in many different forms and should not be construed as limited to the examples of embodiments set forth herein. Rather, these examples of embodiments are provided so that this disclosure will be thorough and complete, and will fully convey a scope of the present disclosure to those skilled in the art. In the drawings, the sizes and relative sizes of layers and regions may be exaggerated for clarity.

It will be understood that when an element or layer is referred to as being "on," "connected to" or "coupled to" another element or layer, the element may be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terminology used herein is for the purpose of describing particular examples of embodiments only and is not intended to be limiting of the present disclosure. As used herein, the singular forms "a," "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Examples of embodiments are described herein with reference to cross-sectional illustrations that are schematic illustrations of idealized examples of embodiments (and intermediate structures). As such, variations from the shapes of the illustrations as a result, for example, of manufacturing techniques and/or tolerances, are to be expected. Thus, examples of the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, regions illustrated in the figures are schematic in nature and their shapes are not intended to illustrate the actual shape of a region of a device and are not intended to limit the scope of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with the meaning in the context of the relevant art and will not be interpreted in an idealized or overly formal sense unless expressly so defined herein.

Hereinafter, example embodiments will be described with reference to the accompanying drawings.

FIG. 1 is a block diagram illustrating a semiconductor device in accordance with example embodiments.

Referring to FIG. 1, a semiconductor device may include a data-generating unit or data generator 100, a signal-transmitting unit or signal-transmitter 200, and a signal-receiving unit or signal-receiver 300. In example embodiments, the semiconductor device may process signals such as data, etc.

The data-generating unit 100 may generate first data DATA_A converted into voltage levels of an external voltage VDD and a ground voltage VSS. For example, when the data-generating unit 100 generates the first data DATA_A having a high level, the data-generating unit 100 may increase a voltage level of the first data DATA_A to a voltage level of the external voltage VDD. When the data-generating unit 100 generates the first data DATA_A having a low level, the data-generating unit 100 may decrease a voltage level of the first data DATA_A to a voltage level of the ground voltage VSS.

The signal-transmitting unit 200 may generate transmission data DATA_tr in response to the first data DATA_A when an enabling signal EN is enabled. The signal-transmitting unit 200 may output the transmission data DATA_tr to input/output lines I/O_Line. The transmission data DATA_tr may be converted into a voltage level lower than the external voltage VDD and the voltage level of the ground voltage VSS.

The signal-transmitting unit 200 may include a pre-driving unit or pre-driver 210 and a main driving unit or main driver 220.

The pre-driving unit 210 may generate a pull-up signal PU and a pull-down signal PD in response to the enabling signal EN and the first data DATA_A. For example, when the enabling signal EN is enabled, the pre-driving unit 210 may enable any one of the pull-up signal PU and the pull-down signal PD in response to the first data DATA_A. When the enabling signal EN is disabled, the pre-driving unit 210 may disable any one of the pull-up signal PU and the pull-down signal PD. The pre-driving unit 210 may receive a driving voltage VNN and the ground voltage VSS. The driving voltage VNN may be higher than the external voltage VDD. The driving voltage VNN may include a voltage applied from an external device to the semiconductor device. Alternatively, the driving voltage VNN may include a voltage generated in the semiconductor device. Voltage levels of the pull-up signal PU and the pull-down signal PD enabled by the pre-driving unit 210 may correspond to the voltage level of the driving voltage VNN so that voltage levels of the pull-up signal PU and the pull-down signal PD may be higher than the voltage level of the external voltage VDD applied to the main driving unit 220. The voltage levels of the disabled pull-up signal PU and the disabled pull-down signal PD may correspond to the voltage level of the ground voltage VSS.

The main driving unit 220 may generate transmission data DATA_tr in response to the pull-up signal PU and the pull-down signal PD. For example, when the pull-up signal PU is enabled, the main driving unit 220 may pull up the transmission data DATA_tr. When the pull-down signal PD is enabled, the main driving unit 220 may pull down the transmission data DATA_tr to the ground voltage VSS level. The main driving unit 220 may perform pull-up operations in response to the pull-up signal PU to output transmission data DATA_tr having a high level. The main driving unit 220 may perform pull-down operations in response to the pull-down signal PD to output the transmission data DATA_tr having a low level. A high voltage level of the transmission data DATA_tr may be lower than a voltage level of the external voltage VDD. A low voltage level of the transmission data DATA_tr may correspond to a voltage level of the ground voltage VSS. Because the main driving unit 220 may output the transmission data DATA_tr through the input/output lines I/O_Line, the main driving unit 220 may pull up and down the input/output lines I/O_Line.

The signal-receiving unit 300 may receive the transmission data DATA_tr through the input/output lines I/O_Line and output a second data DATA_B converted into voltage levels of the external voltage VDD and the ground voltage VSS in response to the transmission data DATA_tr.

The signal-receiving unit 300 may include a first level-shifting unit or first level-shifter 310 and a data-inputting unit or data-inputter 320.

The first level-shifting unit 310 may receive the transmission data DATA_tr converted into a voltage level lower than the external voltage VDD and the voltage level of the ground voltage VSS to generate a level-shifting data DATA_s. The level-shifting data DATA_s may be converted into the voltage levels of the external voltage VDD and the ground voltage VSS. For example, when the first level-shifting unit 310 receives the transmission data DATA_tr converted into a voltage level lower than the voltage level of the external voltage VDD, the first level-shifting unit 310 may shift a level of the transmission data DATA_tr to generate the level-shifting data DATA_s having a level substantially the same as the voltage level of the external voltage VDD. When the first level-shifting unit 310 receives the transmission data DATA_tr converted into the voltage level of the ground voltage VSS, the first level-shifting unit 310 may generate the level-shifting data DATA_s having a level substantially the same as the voltage level of the ground voltage VSS.

The data-inputting unit 320 may drive the level-shifting data DATA_s converted into levels of the external voltage VDD and the ground voltage VS to output the second data DATA_B.

Figure 2:
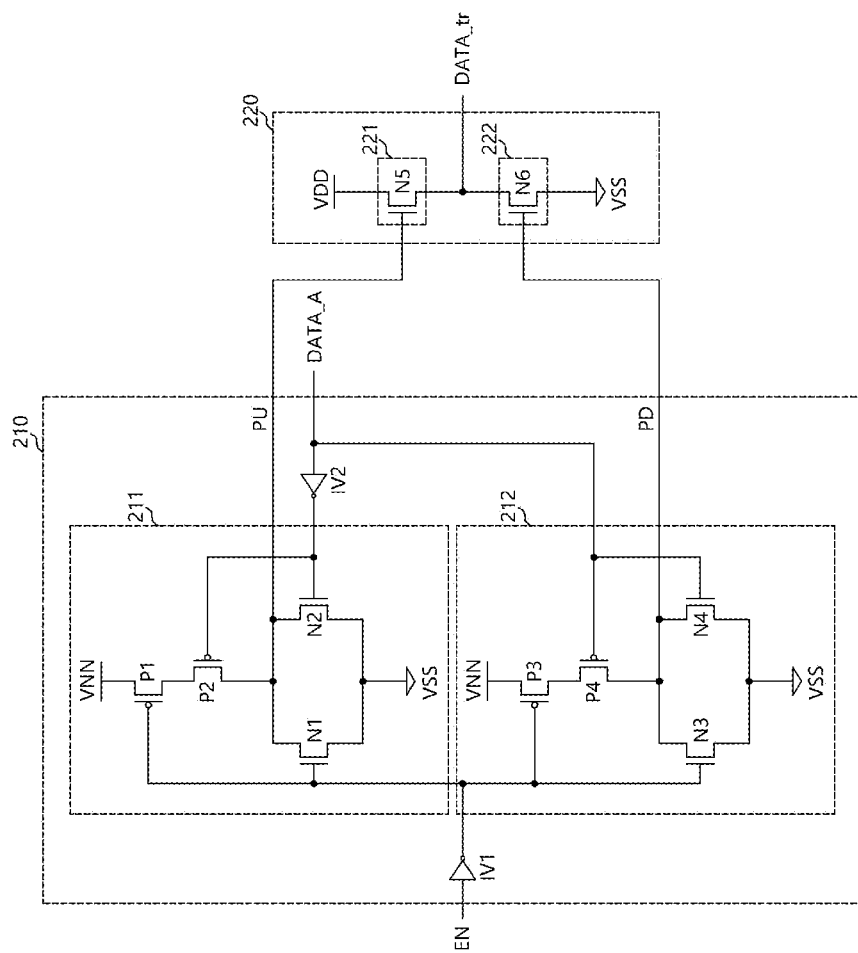
FIG. 2 is a circuit diagram illustrating a signal-transmitting unit shown in FIG. 1 in accordance with example embodiments.

FIG. 2 is a circuit diagram illustrating a signal-transmitting unit shown in FIG. 1 in accordance with example embodiments.

Referring to FIG. 2, the pre-driving unit 210 may include a first inverter IV1, a second inverter IV2, a first logic 211, and a second logic 212.

The first logic 211 may generate the pull-up signal PU in response to the first data DATA_A when the enabling signal EN is enabled. When the enabling signal EN is disabled, the first logic 211 may disable the pull-up signal PU regardless of the state of the first data DATA_A. For example, when the enabling signal EN is enabled to a high level and the first data DATA_A has a high level, the first logic 211 may enable the pull-up signal PU to the level of the driving voltage VNN. When the enabling signal EN is enabled to the high level and the first data DATA_A has a low level, the first logic 211 may disable the pull-up signal PU to the level of the ground voltage VSS. When the enabling signal EN is disabled to the low level, the first logic 211 may disable the pull-up signal PU to the level of the ground voltage VSS.

The first inverter IV1 may receive the enabling signal EN. The second inverter IV2 may receive the first data DATA_A.

The first logic 211 may include a first transistor P1, a second transistor P2, a third transistor N1, and a fourth transistor N2. The first transistor P1 may include a gate configured to receive an output signal from the first inverter IV1, and a source configured to receive the driving voltage VNN. The second transistor P2 may include a gate configured to receive an output signal from the second inverter IV2, and a source connected to a drain of the first transistor P1. The third transistor N1 may include a gate configured to receive the output signal from the first inverter IV1, a drain connected to a drain of the second transistor P2, and a source configured to receive the ground voltage VSS. The fourth transistor N2 may include a gate configured to receive the output signal from the second inverter IV2, a drain connected to the drain of the second transistor P2, and a source configured to receive the ground voltage VSS. The first logic 211 may output the pull-up signal PU from a node commonly connected between the drains of the second, third, and fourth transistors P2, N1 and N2.

Operations of the first logic 211 are illustrated in detail below.

When the enabling signal EN is enabled to a high level, the first inverter IV1 may output the disabled signal having a low level to the first transistor P1 and the third transistor N1. The first transistor P1 receives a signal having a low level and may be turned on to apply the driving voltage VNN to the second transistor P2. When the enabling signal EN is enabled to a high level, i.e., the first transistor P1 is turned on and the third transistor N1 is turned off, the first data DATA_A may be transmitted to the second transistor P2 and the fourth transistor N2 through the second inverter IV2. When the first data DATA_A has a high level, the second transistor P2 may be turned on so that the pull-up signal PU is enabled to the voltage level of the driving voltage VNN. When the first data DATA_A has a low level, the fourth transistor N2 may be turned on so that the pull-up signal PU may be enabled to the voltage level of the ground voltage VSS.

When the enabling signal EN is disabled to the low level, the low level of the signal may be inputted into the first transistor P1 and the third transistor N1 so that the first transistor P1 may be turned off and the third transistor N1 may be turned on. When the enabling signal EN is disabled to the low level, i.e., the third transistor N1 is turned on, the pull-up signal PU may be disabled to the voltage level of the ground voltage VSS regardless of the first data DATA_A. Thus, the first logic 211 may include a NOR gate operated by receiving the driving voltage VNN and the ground voltage VSS.

The second logic 212 may include a fifth transistor P3, a sixth transistor P4, a seventh transistor N3, and an eighth transistor N4. The fifth transistor P3 may include a gate configured to receive the output signal from the first inverter IV1, and a source configured to receive the driving voltage VNN. The sixth transistor P4 may include a gate configured to receive the first data DATA_A, and a source connected to a drain of the fifth transistor P3. The seventh transistor N3 may include a gate configured to receive the output signal from the first inverter IV1, a drain connected to a drain of the sixth transistor P4, and a source configured to receive the ground voltage VSS. The eighth transistor N4 may include a gate configured to receive the first data DATA_A, a drain connected to the drain of the sixth transistor P4, and a source configured to receive the ground voltage VSS. The second logic 212 may generate the pull-down signal PD in response to the first data DATA_A and the enabling signal EN from a node commonly connected between the drains of the sixth, seventh, and eighth transistors P4, N3 and N4.

Operations of the second logic 212 are illustrated in detail below.

When the enabling signal EN is enabled to a high level, the first inverter IV1 may output the disabled signal having a low level to the fifth transistor P3 and the seventh transistor N3. The fifth transistor P3 receives a signal having a low level and may be turned on to apply the driving voltage VNN to the sixth transistor P4. When the enabling signal EN is enabled to a high level, i.e., the fifth transistor P3 is turned on and the seventh transistor N3 is turned off, the first data DATA_A may be transmitted to the sixth transistor P4 and the eighth transistor N4. When the first data DATA_A has a high level, the eighth transistor N4 may be turned on so that the pull-down signal PD is disabled to the voltage level of the ground voltage VSS. When the first data DATA_A has a low level, the sixth transistor P4 may be turned on so that the pull-down signal PD may be enabled to the voltage level of the driving voltage VNN.

When the enabling signal EN is disabled to the low level, the high level of the signal may be inputted into the fifth transistor P3 and the seventh transistor N3 so that the fifth transistor P3 may be turned off and the seventh transistor N3 may be turned on. When the enabling signal EN is disabled to the low level, i.e., the seventh transistor N3 is turned on, the pull-down signal PD may be disabled to the voltage level of the ground voltage VSS regardless of the first data DATA_A. Thus, the second logic 212 may include a NOR gate operated by receiving the driving voltage VNN and the ground voltage VSS.

Particularly, when the enabling signal EN is enabled and the first data DATA_A has the high level, the first logic 211 may output the pull-up signal PU enabled to the voltage level of the driving voltage VNN and the second logic 212 may output the pull-down signal PD disabled to the voltage level of the ground voltage VSS. When the enabling signal EN is enabled and the first data DATA_A has the low level, the first logic 211 may output the pull-up signal PU disabled to the voltage level of the ground voltage VSS and the second logic 212 may output the pull-down signal PD enabled to the voltage level of the driving voltage VNN. That is, when the enabling signal EN is enabled, the first and second logics 211 and 212 may enable any one of the pull-up signal PU and the pull-down signal PD and disable the remaining signals in response to the first data DATA_A. When the enabling signal EN is disabled, the first logic 211 and the second logic 212 may disable the pull-up signal PU and the pull-down signal PD.

The main driving unit 220 may perform the pull-up operation and the pull-down operation in response to the pull-up signal PU and the pull-down signal PD to generate the transmission data DATA_tr.

The main driving unit 220 may include a pull-up unit or pull-up circuit 221 and a pull-down unit or pull-down circuit 222.

The pull-up unit 221 may perform the pull-up operation in response to the pull-up signal PU. For example, when the pull-up signal PU is enabled to the voltage level of the driving voltage VNN, the pull-up unit 221 may perform the pull-up operation to generate the transmission data DATA_tr.

The pull-up unit 221 may include a ninth transistor N5. The ninth transistor N5 may include a gate configured to receive the pull-up signal PU, and a drain configured to receive the external voltage VDD.

The pull-down unit 222 may perform the pull-down operation in response to the pull-down signal PD. For example, when the pull-down signal PD is enabled to the voltage level of the driving voltage VNN, the pull-down unit 222 may perform the pull-down operation to generate the transmission data DATA_tr.

The pull-down unit 222 may include a tenth transistor N6. The tenth transistor N6 may include a gate configured to receive the pull-down signal PD, and a drain connected to a source of the ninth transistor N5, and a source configured to receive the ground voltage VSS. The transmission data DATA_tr may be outputted from a node connected between the ninth transistor N5 and the tenth transistor N6. As mentioned above, the pull-up unit 221 and the pull-down unit 222 may include transistors of substantially the same kind.

When the pull-up signal PU is enabled to the voltage level of the driving voltage VNN, the pull-up unit 221 may perform the pull-up operation to generate the transmission data DATA_tr. Particularly, when the pull-up signal PU is enabled to the voltage level of the driving voltage VNN, the pull-up unit 221 may pull up the transmission data DATA_tr to a voltage level lower than the voltage level of the external voltage VDD. Because the pull-up unit 221 may include the NMOS transistor N5, the NMOS transistor N5 may drop the voltage level of the external voltage VDD applied to the drain of the NMOS transistor N5 and transmit the dropped voltage level of the external voltage VDD when the pull-up unit 221 pulls up the transmission data DATA_tr so that the NMOS transistor N5 may be turned on. That is, when the pull-up unit 221 performs the pull-up operation to generate the transmission data DATA_tr, the voltage level of the transmission data DATA_tr may be lower than the voltage level of the external voltage VDD. When the voltage level of a gate in an NMOS transistor is higher than the voltage level of a source in the NMOS transistor, the voltage drop of the turned-on NMOS transistor may be lower than the voltage drop of the turned-on NMOS transistor when the voltage level of the gate in the NMOS transistor is substantially the same as the voltage level of the source in the NMOS transistor. Thus, the pull-up unit 221 may generate the transmission data DATA_tr having the high level.

Figure 3:
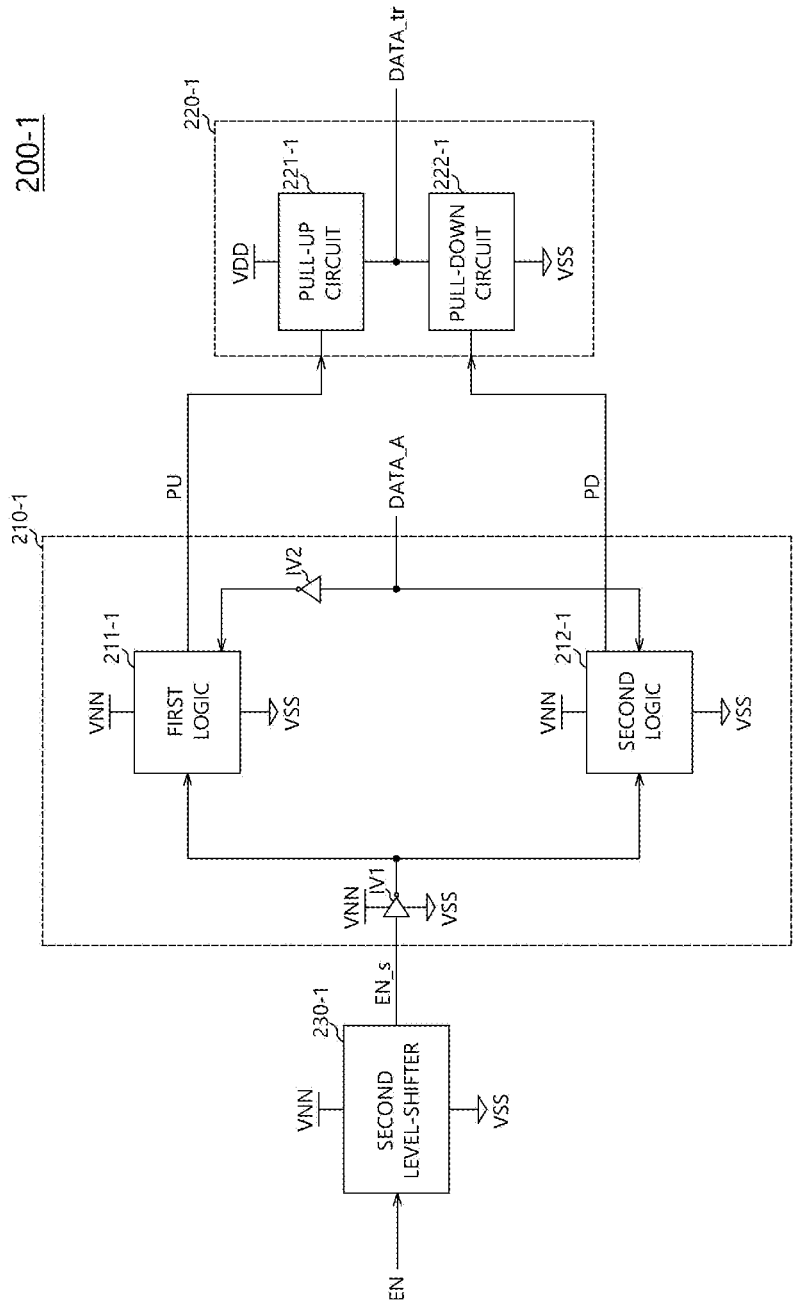
FIG. 3 is a circuit diagram illustrating a signal-transmitting unit shown in FIG. 1 in accordance with example embodiments.

FIG. 3 is a circuit diagram illustrating a signal-transmitting unit shown in FIG. 1 in accordance with example embodiments.

Referring to FIG. 3, a signal-transmitting unit or signal transmitter 200-1 may include a pre-driving unit or pre-driver 210-1, a main driving unit or main driver 220-1, and a second level-shifting unit or second level-shifter 230-1.

The second level-shifting unit 230-1 may receive the enabling signal EN converted into the voltage levels of the external voltage VDD and the ground voltage VSS to generate a level-shifting enabling signal EN_s converted into the voltage levels of the external voltage VDD and the ground voltage VSS. For example, when the second level-shifting unit 230-1 receives the enabling signal EN enabled to the voltage level of the external voltage VDD, the second level-shifting unit 230-1 may generate the level-shifting enabling signal EN_s enabled to the voltage level of the driving voltage VNN. When the second level-shifting unit 230-1 receives the enabling signal EN converted into the voltage level of the ground voltage VSS, the second level-shifting unit 230-1 may generate the level-shifting enabling signal EN_s disabled to the voltage level of the ground voltage VSS.

The pre-driving unit 210-1 may include a first inverter IV1, a second inverter IV2, a first logic 211-1, and a second logic 212-1.

The first logic 211-1 may generate the pull-up signal PU in response to the first data DATA_A when the enabling signal EN is enabled. When the enabling signal EN is disabled, the first logic 211-1 may disable the pull-up signal PU regardless of the first data DATA_A. For example, when the enabling signal EN is enabled to the high level and the first data DATA_A has the high level, the first logic 211-1 may enable the pull-up signal PU to the voltage level of the driving voltage VNN. When the enabling signal EN is enabled to the high level and the first data DATA_A has the low level, the first logic 211-1 may disable the pull-up signal PU to the level of the ground voltage VSS. When the enabling signal EN is disabled to the low level, the first logic 211-1 may disable the pull-up signal PU to the level of the ground voltage VSS.

The first inverter IV1 may receive the level-shifting enabling signal EN_s. The second inverter IV2 may receive the first data DATA_A. The first inverter IV1 may operate by receiving the driving voltage VNN and the ground voltage VSS. Thus, when the level-shifting enabling signal EN_s enabled to the voltage level of the driving voltage VNN is inputted into the first inverter IV1, the first inverter IV1 may reverse the level-shifting enabling signal EN_s to output the reversed level-shifting enabling signal EN_s having the voltage level of the ground voltage VSS. When the level-shifting enabling signal EN_s disabled to the voltage level of the ground voltage VSS is inputted into the first inverter IV1, the first inverter IV1 may reverse the level-shifting enabling signal EN_s to output the reversed level-shifting enabling signal EN_s having the voltage level of the driving voltage VNN.

The first logic 211-1 may receive the driving voltage VNN and the ground voltage VSS. When the enabling signal EN_s is enabled, i.e., the output signal of the first inverter IV1 includes the ground voltage VSS signal, the first logic 211-1 may reverse the output signal of the second inverter IV2 to output the pull-up signal PU. That is, when the output signal of the first inverter IV1 corresponds to the signal having the voltage level of the driving voltage VNN, the first logic 211-1 may fix the pull-up signal PU to a specific level regardless of the output signal of the second inverter IV2. For example, when the enabling signal EN is enabled and the first data DATA_A has the high level, the first logic 211-1 may enable the pull-up signal PU to the voltage level of the driving voltage VNN. When the enabling signal EN is enabled and the first data DATA_A has the low level, the first logic 211-1 may disable the pull-up signal PU to the voltage level of the ground voltage VSS. When the enabling signal EN is disabled, the first logic 211-1 may disable the pull-up signal PU to the voltage level of the ground voltage VSS regardless of the first data DATA_A. The first logic 211-1 may have configurations and functions substantially the same as those of the first logic 211 in FIG. 2.

The second logic 212-1 may receive the driving voltage VNN and the ground voltage VSS. When the enabling signal EN_s is enabled, i.e., the output signal of the first inverter IV1 includes the ground voltage VSS signal, the second logic 212-1 may reverse the first data DATA_A to output the pull-down signal PD. When the enabling signal EN is disabled, i.e., the output signal of the first inverter IV1 corresponds to the signal having a voltage level of the driving voltage VNN, the second logic 212-1 may fix the pull-down signal PD to a specific level regardless of the first data DATA_A. For example, when the enabling signal EN is enabled and the first data DATA_A has the high level, the second logic 212-1 may disable the pull-down signal PD to the voltage level of the ground voltage VSS. When the enabling signal EN is enabled and the first data DATA_A has the low level, the second logic 212-1 may enable the pull-down signal PD to the voltage level of the driving voltage VNN. When the enabling signal EN is disabled, the second logic 212-1 may disable the pull-down signal PD to the voltage level of the ground voltage VSS regardless of the first data DATA_A. The second logic 212-1 may have configurations and functions substantially the same as those of the second logic 212 in FIG. 2.

Particularly, when the enabling signal EN is enabled and the first data DATA_A has the high level, the first logic 211-1 may output the pull-up signal PU enabled to the voltage level of the driving voltage VNN and the second logic 212-1 may output the pull-down signal PD disabled to the voltage level of the ground voltage VSS. When the enabling signal EN is enabled and the first data DATA_A has the low level, the first logic 211-1 may output the pull-up signal PU disabled to the voltage level of the ground voltage VSS and the second logic 212-1 may output the pull-down signal PD enabled to the voltage level of the driving voltage VNN. That is, when the enabling signal EN is enabled, the first and second logics 211-1 and 212-1 may enable any one of the pull-up signal PU and the pull-down signal PD to a voltage level higher than the external voltage VDD and disable the remaining signals to the ground voltage VSS in response to the first data DATA_A. When the enabling signal EN is disabled, the first logic 211-1 and the second logic 212-1 may disable the pull-up signal PU and the pull-down signal PD to the ground voltage VSS level.

The signal-transmitting unit 200-1 in FIG. 3 may further include the second level-shifting unit 230-1 as well as other elements of the signal-transmitting unit 200 in FIG. 2. The first inverter IV1 may operate by receiving the driving voltage VNN and the ground voltage VSS. Thus, the output signal of the first inverter IV1 inputted into the first logic 211-1 and the second logic 212-1 may correspond to a signal for converting the driving voltage VNN and the ground voltage VSS. When the first logic 211-1 and the second logic 212-1 are substantially the same as the first logic 211 and the second logic 212 in FIG. 2, respectively, the transistors P1 and P3 may have a substantially similar operation. For example, the transistors P1 and P3 may include a gate to which the output signal of the first inverter IV1 is applied. The transistors P1 and P3 among the transistors in the first and second logics 211-1 and 212-1 may be turned off by the gate to which a substantially same voltage as the voltage applied to the source may be applied. The transistors P1 and P3, which may be turned off by applying the same voltage to the source and the gate, may function to prevent generation of leakage current.

The main driving unit 220-1 may perform the pull-up operation and the pull-down operation, in response to the pull-up signal PU and the pull-down signal PD, to generate the transmission data DATA_tr.

The main driving unit 220-1 may include a pull-up unit 221-1 or pull-up circuit and a pull-down unit or pull-down circuit 222-1.

The pull-up unit 221-1 may perform the pull-up operation in response to the pull-up signal PU. For example, when the pull-up signal PU is enabled to the voltage level of the driving voltage VNN, the pull-up unit 221-1 may perform the pull-up operation to generate the transmission data DATA_tr. The pull-up unit 221-1 may be substantially the same as the pull-up unit 221 in FIG. 2.

The pull-down unit 222-1 may perform the pull-down operation in response to the pull-down signal PD. For example, when the pull-down signal PD is enabled to the voltage level of the driving voltage VNN, the pull-down unit 222-1 may perform the pull-down operation to generate the transmission data DATA_tr. The pull-down unit 222-1 may be substantially the same as the pull-down unit 222 in FIG. 2. The pull-up unit 221-1 and the pull-down unit 222-1 may include a same kind of a transistor.

When the pull-up signal PU is enabled to the voltage level of the driving voltage VNN, the pull-up unit 221-1 may perform the pull-up operation to generate the transmission data DATA_tr. Particularly, when the pull-up signal PU is enabled to the voltage level of the driving voltage VNN, the pull-up unit 221-1 may pull up the transmission data DATA_tr to a voltage level lower than the voltage level of the external voltage VDD. In other words, the pull-up unit 221-1 may pull up the transmission data DATA_tr to a voltage level between the external voltage VDD and the ground voltage VSS when the pull-up signal PU is enabled. The pull-up unit 221-1 may include the NMOS transistor N5 of the pull-up unit 221 in FIG. 2. When the pull-up unit 221-1 pulls up the transmission data DATA_tr, i.e., the NMOS transistor is turned on, the NMOS transistor N5 may drop the voltage level of the external voltage VDD applied to the drain of the NMOS transistor N5 and transmit the dropped voltage level to the source of the NMOS transistor. That is, when the pull-up unit 221 performs the pull-up operation to generate the transmission data DATA_tr, the voltage level of the transmission data DATA_tr may be lower than the voltage level of the external voltage VDD. The voltage drop of the turned-on NMOS transistor when the voltage level of a gate in an NMOS transistor is higher than the voltage level of a source in the NMOS transistor, a voltage drop of the turned-on NMOS transistor may be lower than the voltage drop of the turned-on NMOS transistor when the voltage level of the gate in the NMOS transistor is substantially the same as the voltage level of the source in the NMOS transistor. Thus, the pull-up unit 221-1 may generate the transmission data DATA_tr having the high level.

Hereinafter, operations of the semiconductor device are illustrated in detail below.

The data-generating unit 100 operated by the external voltage VDD and the ground voltage VSS may output the first data DATA_A. The first data DATA_A may be converted into the external voltage VDD and the ground voltage VSS.

The signal-transmitting unit 200-1 may output the transmission data DATA_tr to the input/output lines I/O_Line in response to the first data DATA_A and the enabling signal EN. The transmission data DATA_tr may be converted into a voltage lower than the external voltage VDD and the ground voltage VSS. When the transmission data DATA_tr is a voltage lower than the voltage level of the external voltage VDD, the voltage level of the transmission data DATA_tr may be higher than the voltage level of the ground voltage VSS.

The signal-transmitting unit 200-1 may include the pre-driving unit or pre-driver 210-1 and the main driving unit or main driver 220-1.

When the enabling signal is enabled, the pre-driving unit 210-1 may enable any one of the pull-up signal PU and the pull-down signal PD and disable the remaining signals in response to the first data DATA_A. For example, when the enabling signal EN is enabled and the first data DATA_A has the high level, the pre-driving unit 210-1 may enable the pull-up signal PU to the voltage level of the driving voltage VNN and disable the pull-down signal PD to the voltage level of the ground voltage VSS. When the enabling signal EN is enabled to the high level and the first data DATA_A has the low level, the pre-driving unit 210-1 may disable the pull-up signal PU to the level of the ground voltage VSS and enable the pull-down signal PD to the voltage level of the driving voltage VNN. When the enabling signal EN is disabled, the pre-driving unit 210-1 may disable the pull-up signal PU and the pull-down signal PD to the level of the ground voltage VSS.

The main driving unit 220-1 may generate the transmission data DATA_tr in response to the transmission data DATA_tr. The main driving unit 220-1 may output the transmission data DATA_tr to the input/output lines I/O_Line. The main driving unit 220-1 may operate by receiving the external voltage VDD and the ground voltage VSS. The driving voltage VNN may have a voltage level higher than the voltage level of the external voltage VDD.

The main driving unit 220-1 may include the pull-up unit 221-1 and the pull-down unit 222-1 with the NMOS transistors N5 and N6.

The pull-up unit 221-1 may perform the pull-up operation in response to the pull-up signal PU. The pull-up unit 221-1 may include the NMOS transistor N5 including a gate and a source. The gate of the NMOS transistor N5 may receive a pull-up signal PU enabled to a voltage level of the driving voltage VNN. The source of the NMOS transistor N5 may receive the external voltage VDD. A turn-on resistance, i.e., a voltage drop of the NMOS transistor N5 may be lower than a voltage drop of the turned-on NMOS transistor N5, where the voltage drop of the NMOS transistor N5 may occur when the voltage level of the gate in the NMOS transistor N5 is higher than the voltage level of the source in the NMOS transistor N5, and where the voltage drop of the turned-on NMOS transistor N5 may occur when the voltage level of the gate in the NMOS transistor N5 is substantially the same as the voltage level of the source in the NMOS transistor N5. Thus, because the voltage level applied to the source of the turned-on transistor N5 may be higher than the voltage level of the gate of the turned-on transistor N5, the turn-on resistance, i.e., the voltage drop of the transistor N5 may be lower than that of the turned-on transistor N5 when applying the same voltage level to the gate and the source.

The pull-down unit 222-1 may perform the pull-down operation in response to the pull-down signal PD. The pull-down unit 222-1 may include the NMOS transistor N6 including the gate and the source. The gate of the NMOS transistor N6 may receive the pull-down signal PD enabled to the voltage level of the driving voltage VNN. The source of the NMOS transistor N6 may receive the external voltage VDD. A turn-on resistance, i.e., the voltage drop of the NMOS transistor N6 may be lower than the voltage drop of the turned-on NMOS transistor N6, where the voltage drop of the NMOS transistor N6 occurs when the voltage level of the gate in the NMOS transistor N6 is higher than the voltage level of the source in the NMOS transistor N6, and the voltage drop of the turned-on NMOS transistor N6 occurs when the voltage level of the gate in the NMOS transistor N6 is substantially the same as the voltage level of the source in the NMOS transistor N6. Thus, because the voltage level applied to the source of the turned-on transistor N6 may be higher than the voltage level of the gate of the turned-on transistor N6, the turn-on resistance, i.e., the voltage drop of the transistor N6 may be lower than that of the turned-on transistor N6 when applying the same voltage level to the gate and the source.

The main driving unit 220-1 may output the transmission data DATA_tr swung to a voltage level lower than the external voltage VDD and the ground voltage VSS so that the main driving unit 220-1 may have low power consumption. The pull-up unit 221-1 and the pull-down unit 222-1 in the main driving unit 220-1 may each include an NMOS transistor. Further, the NMOS transistors may be turned on by enabling the signals PU and PD to a voltage level higher than the level of the voltage applied to the drain, where the signals PU and PD are applied to a gate of the NMOS transistors main driving unit 220-1. Thus, the NMOS transistor(s) may have a voltage drop relatively lower than that of the NMOS transistor(s) turned on by applying the same voltage level to the gate and the drain of the NMOS transistor(s) so that a slew rate of the transmission data DATA_tr may be increased.

The transmission data DATA_tr may be inputted into the first level-shifting unit 310 through the input/output lines I/O_Line.

The transmission data DATA_tr converted into a voltage level lower than the external voltage VDD, and the ground voltage VSS may be converted into level-shifting data DATA_s capable of fully swinging in the voltage levels of the external voltage VDD and the ground voltage VSS through the first level-shifting unit 310.

The data-inputting unit 320 may receive the level-shifting data DATA_s. The data-inputting unit 320 may output the second data DATA_B converted into voltage levels of the external voltage VDD and the ground voltage VSS.

The first data DATA_A and the second data DATA_B may swing in voltage levels of the external voltage VDD and the ground voltage VSS so that the swing widths of the first and second data DATA_A and DATA_B may be substantially same with each other. The pull-up signal PU and the pull-down signal PD may swing in a driving voltage VNN higher than the external voltage VDD and the ground voltage VSS so that the swing width of the pull-up signal PU and the pull-down signal PD may be wider or greater than the swing width of the first and second data DATA_A and DATA_B. The transmission data DATA_tr may swing in a voltage level lower than the external voltage VDD and the ground voltage VSS so that the swing width of the transmission data DATA_tr may be narrower than the swing width of the first and second data DATA_A and DATA_B.

According to example embodiments, the semiconductor device may generate the data having a swing width narrower than that of fully swung data and output the data through the input/output line. Thus, the semiconductor device may have low power consumption in transmitting the signals.

The above embodiments of the present disclosure are illustrative and not limitative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:

1. A semiconductor device comprising:
a signal-transmitter configured to generate a pull-up signal and a pull-down signal in response to a first data and output a transmission data to an input/output line in response to the pull-up signal and the pull-down signal; and
a signal-receiver configured to receive the transmission data through the input/output line and output a second data,
wherein the first data has a swing width substantially the same as a swing width of the second data, the pull-up signal and the pull-down signal have a swing width greater than the swing width of the first and second data, and the transmission data has a swing width narrower than the swing width of the first and second data.

2. The semiconductor device of claim 1, wherein the signal-transmitter is configured to generate the pull-up signal and the pull-down signal converted into a voltage level of a ground voltage and a voltage level higher than a voltage level of the external voltage in response to the first data converted into the voltage level of the external voltage and the voltage level of the ground voltage, and generate the transmission data converted into the voltage level of the ground voltage and a first voltage level lower than the voltage level of the external voltage.

3. The semiconductor device of claim 2, wherein the first voltage level is higher than the voltage level of the ground voltage.

4. The semiconductor device of claim 2, wherein the signal-transmitter comprises:
   a pre-driver configured to generate the pull-up signal and the pull-down signal in response to the first data; and
   a main driver configured to generate the transmission data in response to the pull-up signal and the pull-down signal.

5. The semiconductor device of claim 4, wherein the pre-driver is configured to receive the ground voltage and a driving voltage having a voltage level higher than the voltage level of the external voltage, convert any one of the pull-up signal and the pull-down signal to the voltage level of the driving voltage in response to the first data, and convert the remaining signals to the voltage level of the ground voltage in response to the first data.

6. The semiconductor device of claim 4, wherein the main driver is configured to pull up the transmission data to a voltage level lower than the voltage level of the external voltage in response to the pull-up signal, and pull down the transmission data to the voltage level of the ground voltage in response to the pull-down signal.

7. The semiconductor device of claim 1, wherein the signal-receiver comprises:
   a level-shifter configured to receive the transmission data to convert the transmission data into a level-shifting data converted to voltage levels of an external voltage and a ground voltage; and
   a data-inputter configured to receive the level-shifting data and output a second data.

* * * * *